(12) United States Patent
Hoogeveen et al.

(10) Patent No.: US 7,215,190 B2
(45) Date of Patent: May 8, 2007

(54) MAGNETIC RESONANCE IMAGING METHOD INVOLVING SUB-SAMPLING

(75) Inventors: Romhild Martijn Hoogeveen, Eindhoven (NL); Frederik Visser, Eindhoven (NL); Lolkje Frederika Zoer, Eindoven (NL); Willem Marten Prins, Eindhoven (NL); Johan Samuel Van Den Brink, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 0 days.

(21) Appl. No.: 10/496,388

(22) PCT Filed: Nov. 20, 2002

(86) PCT No.: PCT/IB02/04870

§ 371 (c)(1),
(2), (4) Date: May 24, 2004

(87) PCT Pub. No.: WO03/046598

PCT Pub. Date: Jun. 5, 2003

(65) Prior Publication Data

US 2005/0007113 A1     Jan. 13, 2005

(30) Foreign Application Priority Data

Nov. 26, 2001   (EP)   .................................. 01204539

(51) Int. Cl.
*G01V 3/00*       (2006.01)
(52) U.S. Cl. .................................................... 329/309

(58) Field of Classification Search ................ 324/307, 324/309
See application file for complete search history.

(56) References Cited

U.S. PATENT DOCUMENTS 6,326,786 B1 *  12/2001  Pruessmann et al. ....... 324/312

FOREIGN PATENT DOCUMENTS

WO    WO 99/54746       10/1999
WO    WO 02/10787 A1    2/2002

OTHER PUBLICATIONS

Vlaardingerbroek, et al.; Magnetic Resonance Imaging, 2nd ed.; Section 2.4.1.1.
Pruessmann, K., et al.; SENSE: Sensitivity Encoding for Fast MRI; Magnetic Resonance in Medicine; vol. 42: 1999, pp. 952-962.

(Continued)

*Primary Examiner*—Brij Shrivastav
*Assistant Examiner*—Dixomara Vargas
(74) *Attorney, Agent, or Firm*—Thomas M. Lundin

(57) ABSTRACT

In a magnetic resonance imaging method magnetic resonance signal samples are received for a predetermined field of view by a receiving antenna having a spatial sensitivity profile. The sampling in the k space corresponds to the predetermined field of view in the geometrical space. Folded-over images having folded-over pixel values are reconstructed from the sampled magnetic resonance signals. Pixel contributions for spatial positions within the predetermined field of view are calculated from the folded-over pixel values and the spatial sensitivity profile of the receiver antenna. The magnetic resonance image is formed from the pixel contributions for spatial positions within the predetermined field of view. Thus, aliasing or fold-over artefacts caused by a field of view that is too small are avoided.

6 Claims, 2 Drawing Sheets

OTHER PUBLICATIONS

Figure 1:
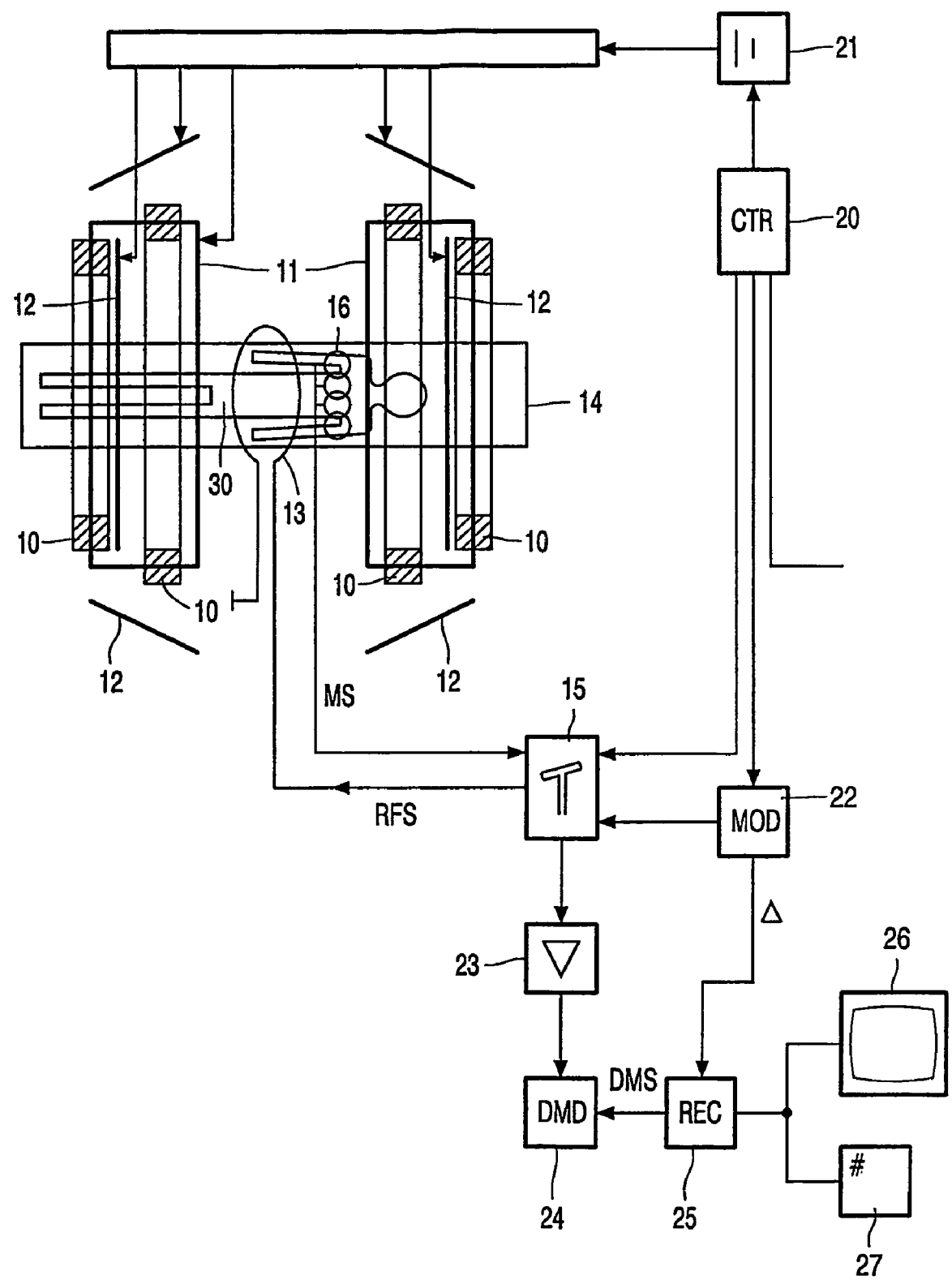

Hu, X., et al.; Reduction of Field of View for Dynamic Imaging; 1994; MRM; 39-691-694.

Kellman, P., et al.; Adaptive Sensitivity Encoding Incorporating Temporal Filtering (TSENSE); 2001; MRM; 45(5) 846-852.

* cited by examiner

MAGNETIC RESONANCE IMAGING METHOD INVOLVING SUB-SAMPLING

The invention relates to a magnetic resonance imaging method in which
  sampled magnetic resonance signals are received by means of a receiving antenna having a spatial sensitivity profile,
    the sampling in the k space corresponding to a predetermined field of view in the geometrical space, and
  folded-over pixel values of a folded-over image are reconstructed from the sampled magnetic resonance signals.

A magnetic resonance imaging method of the kind set forth is known from the handbook '*Magnetic resonance imaging, $2^{nd}$ ed.*' by M. T. Vlaardingerbroek and J. A. den Boer.

Notably section 2.4.1.1. of the cited handbook states in respect of discrete sampling that the choice of the discrete sampling predetermines the field of view. Contributions to the magnetic resonance signals which originate from a part of the object to be examined which extends outside the predetermined field of view give rise to the folded-over pixel values with contributions which belong to positions inside and outside the predetermined field of view. Consequently, so-called fold-over or aliasing artefacts occur in the magnetic resonance image reconstructed while utilizing the folded-over pixel values. In order to avoid such fold-over artefacts in accordance with the cited handbook it is necessary to increase the degree of sampling so that oversampling of the magnetic resonance signals takes place. Such oversampling has the drawback that the acquisition of the magnetic resonance signals is very time-consuming.

It is an object of the present invention to provide a magnetic resonance imaging method which enables fast magnetic resonance imaging and avoids the so-called fold-over phenomena in the magnetic resonance image.

In accordance with the invention this object is achieved by means of a magnetic resonance imaging method
  in which pixel contributions at spatial positions within the predetermined field of view are calculated from the folded-over pixel values and the sensitivity profile of the receiving antenna, and
  the magnetic resonance image is formed from these pixel contributions at spatial positions within the predetermined field of view.

Folded-over pixel values arise due to the fact that the predetermined field of view is smaller than the object to be examined, for example, the patient to be examined; the degree of sampling of the magnetic resonance signals in the k space thus is lower than would be necessary for a field of view in which the object to be examined fits completely. Consequently, magnetic resonance signals occur which originate from a part of the object to be examined. The predetermined field of view can be deliberately chosen so as to be too small, thus reducing the signal acquisition time as much as possible. It may also be that the predetermined field of view is not deliberately chosen to be too small, for example, due to inaccurate adjustment of the predetermined field of view and/or the positioning of the patient to be examined. In accordance with the invention the folded-over pixel values are picked up by means of the receiving antenna having the spatial sensitivity profile. The folded-over pixel values are thus spatially encoded on the basis of the values of the spatial sensitivity profile, that is, in addition to the customary spatial encoding on the basis of temporary magnetic gradient fields such as read-out gradients and phase encoding gradients. In accordance with the invention the pixel contributions at spatial positions within the predetermined field of view can be calculated from the folded-over pixel values on the basis of the spatial sensitivity profile of the receiving antenna. Fold-over artefacts are avoided by reconstructing the magnetic resonance image from the pixel contributions at spatial positions within the predetermined field of view. In accordance with the invention it is notably not necessary to take intricate steps which are aimed at suppressing fold-over artefacts. It is notably not necessary to apply time-consuming regional saturation techniques (REST) so as to realize fold-over suppression.

These and other aspects of the invention will be described in detail hereinafter on the basis of the following embodiments which are defined in the dependent claims.

The acquisition time of the magnetic resonance signals is shorter as the preselected field of view is smaller; this is because the degree of sampling of the magnetic resonance signals in the k space is lower in the case of a smaller field of view. In accordance with the invention it is even possible to choose the predetermined field of view to be so small that sub-sampling of the magnetic resonance signals takes place. It is thus achieved that the acquisition time is considerably reduced. For example, the predetermined field of view is reduced in one direction and, analogously, the magnetic resonance signals are sub-sampled in one direction in the k space, for example, a phase encoding direction.

Sub-sampling gives rise to aliasing in the receiving coil images reconstructed from the sub-sampled magnetic resonance signals of respective antenna components of the receiving antenna. A further spatial encoding of the sub-sampled magnetic resonance signals is available on the basis of the spatial sensitivity profiles. The magnetic resonance image for a complete field of view can thus be reconstructed from the sub-sampled magnetic resonance signals while utilizing the spatial sensitivity profiles. The ratio of the dimensions of the full field of view to those of the reduced field of view is referred to as the reduction factor.

It is to be noted that a magnetic resonance imaging method in which sub-sampled magnetic resonance signals are acquired is known per se from the article '*SENSE: Sensitivity encoding for fast MRI*' in Magn. Reson. Med. 42 (1999), pp. 952–962, by Klaas P. Pruessmann et al. According to the magnetic resonance imaging method utilizing this SENSE technique magnetic resonance signals are acquired in a sub-sampled fashion while using surface receiving coils. These surface receiving coils constitute the receiving antenna. The sampling distance in the k space is then increased relative to the sampling distance required for the complete field of view in accordance with the Nyquist theorem. The sub-sampling results in a reduced field of view. In conformity with the known magnetic resonance imaging method, receiving coil images are reconstructed from the sub-sampled magnetic resonance signals of respective surface receiving coils. These receiving coil images contain fold-over or aliasing phenomena because the reduced field of view is too small relative to the magnitude of the zone wherefrom the magnetic resonance signals are received. On the basis of the spatial sensitivity profile of the receiving antenna the contributions to the folded-over pixel values of the receiving coil images can be decomposed into contributions at different spatial positions in the full field of view. These contributions form pixel values of the magnetic resonance image for the full field of view. When the magnetic resonance image is formed from the receiving coil images, the known magnetic resonance imaging method utilizing the SENSE technique sets contributions for which it is known a priori that they are situated outside the object to be imaged to the value zero, because no signal can arise from positions outside the object. The signal-to-noise ratio of the magnetic resonance image formed from the receiving coil images is thus enhanced on the basis of the spatial sensitivity profile. When the SENSE technique is used for the reconstruction from the receiving coil images, the reduction factor of the dimensions of the predetermined field of view relative to the dimensions of the full field of view is also referred to as the SENSE factor. When the magnetic resonance image for the full field of view is reconstructed from the sub-sampled magnetic resonance signals, it is necessary to choose the full field of view, or the reduction factor, to be such that the object to be examined is situated within the full field of view. It is thus achieved that, in addition to the fold-over phenomena due to the sub-sampling, there will be no fold-over phenomena due to magnetic resonance signals from positions situated outside the full field of view. If the full field of view does not completely cover the object to be examined after all and signal contributions still occur from outside the full field of view, in given circumstances reconstruction of the magnetic resonance image in which no or hardly any fold-over artefacts occur is possible nevertheless by applying a regularization of the reconstruction on the basis of a priori information. Regularization of this kind is described per se in the international application EP01/08120 (PHNL000501).

Usually separate RF receiving coils, such as surface coils, are used as the antenna components. The aliasing means that the folded-over pixel values, or folded-over brightness values, of these receiving coil images are superpositions of contributions to the folded-over pixel values at spatial positions inside and outside the reduced field of view. Each time superpositions of contributions occur at spatial positions which are situated exactly one size of the field of view apart. This superposition becomes manifest as fold-over phenomena in the receiving coil images. In accordance with the invention from such a superposed folded-over pixel value there is calculated the contribution relating to the position within the reduced field of view, so without the contributions which are actually folded over from positions outside the reduced field of view. The pixel contribution within the reduced field of view can be calculated for individual positions within the reduced field of view on the basis of the folded-over pixel values of various receiving coil images and the spatial sensitivity profiles of the receiving coils. The magnetic resonance image within the reduced field of view is formed from the pixel contributions within the reduced field of view.

The predetermined field of view can be readily selected. The predetermined field of view can be simply controlled on the basis of the strength of the temporary magnetic gradient fields. More specifically, the strength of the gradient pulses in the phase encoding direction determines the dimension in the phase encoding direction of the reduced field of view which acts as the predetermined field of view. The strength of the magnetic gradient pulses can be simply adjusted by control of the electric current through the gradient coils. The magnetic resonance imaging system is preferably provided with a user interface whereby the desired location and dimensions of the predetermined field of view are entered. The user interface also includes software for calculating the associated gradient pulses. The magnetic resonance image is substantially or even completely devoid of fold-over phenomena because only the pixel contributions within the reduced field of view have been used.

The pixel contributions within the predetermined, for example, reduced field of view can be readily calculated by decomposing, on the basis of the spatial sensitivity profile of the receiving antenna, notably of the individual RF receiving coils, the folded-over pixel values into the pixel contributions within the predetermined, for example, reduced, field of view and pixel contributions outside the reduced field of view. The pixel contributions at positions within the predetermined, for example, reduced, field of view are obtained simply by rejecting the contributions outside the predetermined, for example, reduced, field of view. In accordance with the invention more contributions are rejected than in the known magnetic resonance imaging method as disclosed in the article by Pruessmann in which only contributions from outside the object to be examined are omitted. This is because the reduced field of view is smaller (in practice even very much smaller) than the dimensions of the object to be examined.

A further implementation of the invention involves the acquisition of sub-sampled magnetic resonance signals corresponding to a reduced field of view. A full field of view is associated with the reduced field of view via the additional spatial encoding on the basis of the spatial sensitivity profile. The full field of view corresponds to the complete sampling which comprises the sub-sampling of the acquired magnetic resonance signals and the additional spatial encoding by way of the spatial sensitivity profile. Within the full field of view a smaller field of view is used as the predetermined field of view. The pixel contributions within the smaller field of view are calculated, on the basis of the spatial sensitivity profile, from the sub-sampled magnetic resonance signals. Preferably, receiving coil images are then reconstructed, while using the known SENSE technique, with folded-over pixel values in relation to the reduced field of view. Only those pixel values from among the folded-over pixel values which are situated within the predetermined smaller field of view are used to form the magnetic resonance image in relation to the smaller field of view. The smaller field of view is preferably chosen to be such that anatomical details of interest are situated exactly within the smaller field of view. To this end, for example, the situation and/or the orientation of the smaller field of view within the full field of view is chosen by the user on the basis of the situation and/or orientation of the region of interest within the object. It is also possible to program in advance a number of frequently used situations and frequently used smaller fields of view for various types of examinations. The user can thus more readily select a suitable smaller field of view. Reconstructing the magnetic resonance image from the pixel contributions within the smaller field of view yield a reconstruction of a magnetic resonance image of the relevant anatomical detail without serious fold-over artefacts, so an image of high diagnostic quality. Moreover, because of the sub-sampling used, only a short acquisition time is required for the magnetic resonance signals. This implementation of the invention is particularly suitable for forming a magnetic resonance image of high diagnostic quality of a given region of interest. The region of interest is usually smaller than the whole object; for example, the region of interest concerns a part or even a detail of the object to be examined. For example, in the case of cardiological applications the region of interest is the region of the heart of the patient to be examined. In accordance with the invention a smaller field of view can be chosen which is smaller than the object as a whole and corresponds to the region of interest. With the smaller field of view there is associated a sampling degree in the k space which has been reduced relative to a full field of view in which the object fits as a whole. For example, using the SENSE technique a magnetic resonance image can be reconstructed for the full field of view on the basis of this reduced sampling degree and the spatial encoding on the basis of the coil sensitivity profiles. This full field of view is overproportioned relative to the region of interest, but in accordance with the invention the magnetic resonance image of the region of interest is reconstructed on the basis of the pixel contributions at positions within the region of interest so that fold-over artefacts due to magnetic resonance signal contributions from outside the region of interest are avoided.

Preferably, successive local fields of view are chosen within the reduced field of view and successive magnetic resonance images are formed each time from the pixel contributions at spatial positions within the relevant local field of view. For example, successive local fields of view can be chosen so as to become smaller monotonously, so that it is possible to zoom in on a detail on the basis of the successive magnetic resonance images. Zooming out is readily possible by utilizing monotonously increasing local fields of view, zooming out is already possible. The successive magnetic resonance images with the each time slightly larger local fields of view then depict an increasingly larger zone around the center of the image. It is also possible to shift the successive local fields of view within the reduce field of view while maintaining the dimensions. This is the so-called panning function where the successive magnetic resonance images depict a region which is shifted each time.

The invention also relates to a magnetic resonance imaging system. A magnetic resonance imaging system in accordance with the invention is defined in claim 8. The magnetic resonance imaging system in accordance with the invention enables fast formation of a magnetic resonance image of the predetermined field of view without giving rise to fold-over artefacts in the magnetic resonance image.

The invention also relates to a computer program. A computer program in accordance with the invention is defined in claim 9. The computer program in accordance with the invention can be loaded into the working memory of a computer included in the magnetic resonance imaging system. This enables the magnetic resonance imaging system to carry out the magnetic resonance imaging method in accordance with the invention. The computer program in accordance with the invention can be made available on a data carrier such as a CD ROM, but it can also be loaded into the working memory via a data network, for example, the world wide web.

Figure 2:
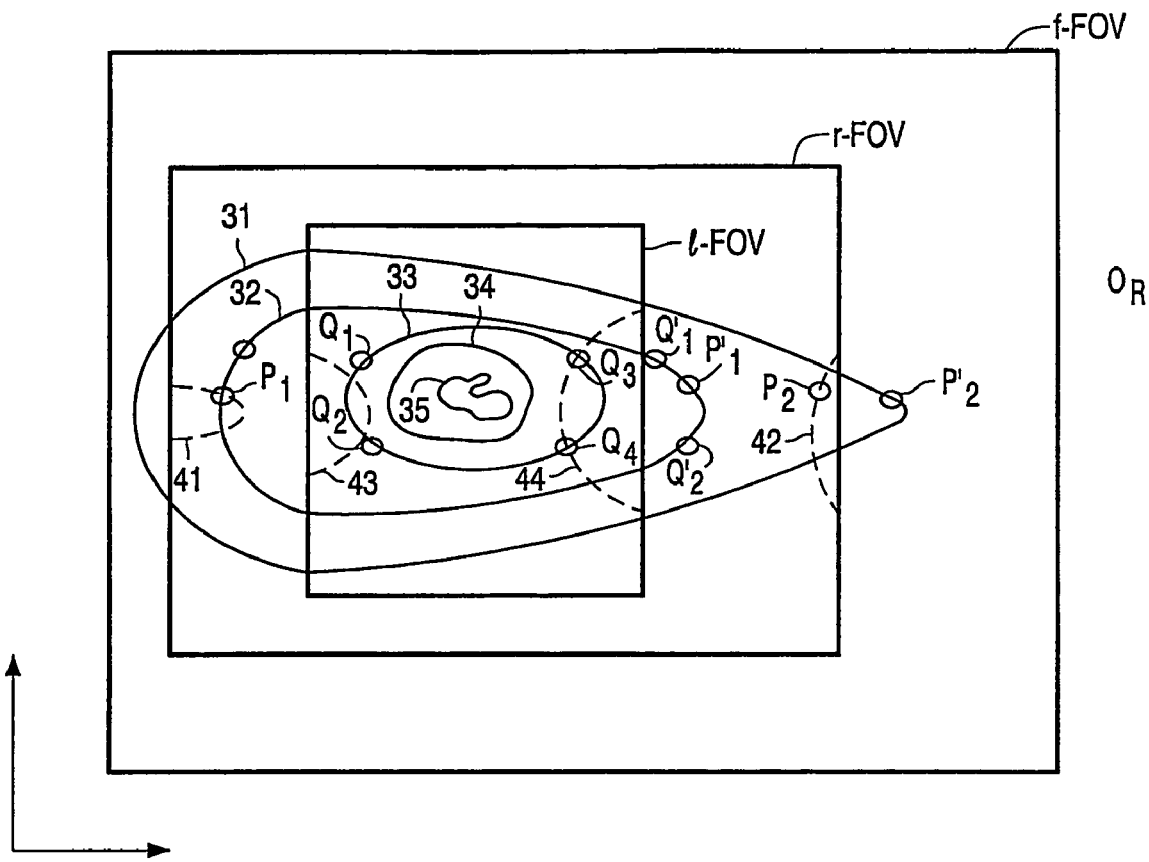
Figure 3:
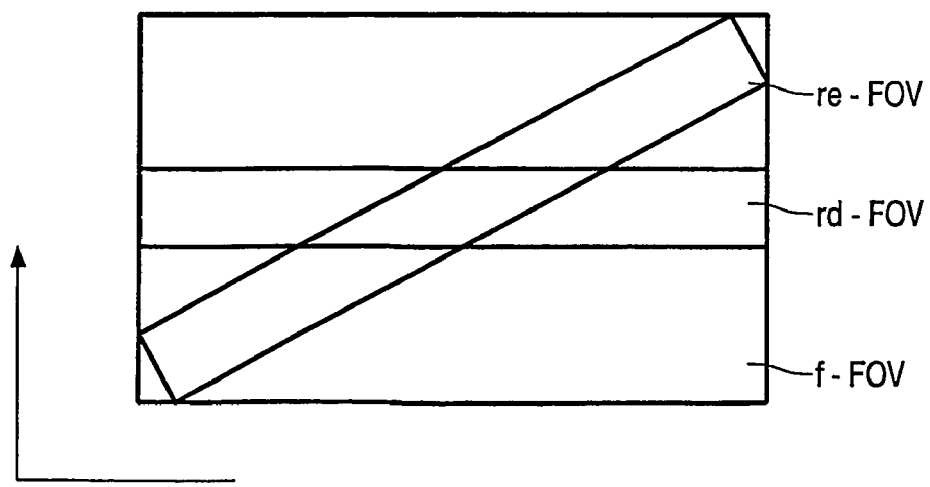

These and other aspects of the invention will be described in detail hereinafter, by way of example, on the basis of the following embodiments and with reference to the accompanying drawing. Therein:

FIG. 1 is a diagrammatic representation of a magnetic resonance imaging system in which the invention is used, FIG. 2 shows a diagram with examples of the full field of view, containing a reduced field of view and a local field of view, relative to an object 31 to be examined, and FIG. 3 shows a diagram with further examples of the full field of view, containing a reduced field of view and a local field of view, relative to an object 31 to be examined.

FIG. 1 is a diagrammatic representation of a magnetic resonance imaging system in which the invention is used. The magnetic resonance imaging system is provided with a set of main coils 10 whereby the steady, uniform magnetic field is generated. The main coils are constructed, for example, in such a manner that they enclose a tunnel-shaped examination space. The patient to be examined is introduced into this tunnel-shaped examination space. The magnetic resonance imaging system also includes a number of gradient coils 11, 12 whereby magnetic fields with spatial variations in the form of notably temporary gradients in separate directions are superposed on the uniform magnetic field. The gradient coils 11, 12 are connected to a controllable power supply unit 21. The gradient coils 11, 12 are energized by application of electric currents thereto by way of the power supply unit 21. The strength, direction and duration of the gradients are controlled by control of the power supply unit. The magnetic resonance imaging system also includes transmission and receiving coils 13, 15 for generating the RF excitation pulses and for receiving the magnetic resonance signals, respectively. The RF excitation pulses excite (nuclear) spins in the object to be examined, or the patient to be examined, that is, in the steady magnetic field. Subsequently, the excited (nuclear) spins relax while emitting magnetic resonance signals. The magnetic resonance signals may be free induction decay (FID) signals, but magnetic resonance echoes may also be generated. In particular spin echo signals can be generated by application of refocusing RF pulses. It is also possible to generate gradient echo signals by application of temporary gradient fields. Application of the temporary gradient fields provides spatial encoding of the magnetic resonance signals. The transmission coil 13 is preferably constructed as a body coil whereby (a part of) the object to be examined can be enclosed. The body coil is usually arranged in the magnetic resonance imaging system in such a manner that the patient 30 positioned in the magnetic resonance imaging system is situated within the body coil 13. The body coil 13 acts as a transmission antenna for the transmission of the RF excitation pulses and RF refocusing pulses. The body coil 13 preferably has a spatially homogeneous intensity distribution of the transmitted RF pulses. Usually the same coil or antenna is used alternately as a transmission coil and as a receiving coil. Furthermore, the transmission and receiving coil also is usually shaped as a coil, but other geometries where the transmission and receiving coil functions as a transmission and receiving antenna for RF electromagnetic signals are also feasible. The transmission and receiving coil 13 is connected to an electronic transmission/receiving circuit 15. The magnetic resonance imaging system also includes a control unit 20, for example, in the form of a computer which is provided with a (micro)processor and stores a computer program with instructions for carrying out the magnetic resonance imaging method in accordance with the invention. The control unit 20 controls the RF pulses such as excitation pulses and refocusing pulses. The control unit in the magnetic resonance imaging system in accordance with the invention is notably arranged to adjust the dimensions of the reduced field of view and of possibly successive local fields of view on the basis of the strengths of the temporary magnetic gradient fields.

Separate receiving coils 16 are used in addition to the body coil 13. For example, surface coils can be used as receiving coils. Such surface coils have a high sensitivity in a comparatively small spatial zone. The body coil 13 and the surface coils constitute the separate antenna components of the receiving antenna. The transmission coils, such as the surface coils, are connected to a demodulator 24 and the magnetic resonance signals received (RFS) are demodulated by means of the demodulator 24. The demodulated magnetic resonance signals (DMS) are applied to a reconstruction unit 25. The individual antenna components, such as the surface coils, are connected to the reconstruction unit 25 by way of separate signal channels. The receiving coils are connected to a preamplifier 23. The preamplifier 23 amplifies the RF resonance signal (RFS) received by the receiving coil and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission/receiving circuit 15 activate the transmission coil 13 so as to transmit the RF excitation and refocusing pulses. The reconstruction unit derives one or more image signals, representing the image information of the imaged part of the object to be examined, from the demodulated magnetic resonance signals (DMS). In practice the reconstruction unit 25 is preferably constructed as a digital image processing unit 25 which is programmed to form the image signals from the demodulated magnetic resonance signals while utilizing the sensitivity profile of the receiving antenna, said image signals representing the image information of the relevant part of the object to be imaged. The reconstruction unit is notably arranged to decompose folded-over pixel values into the contributions within and outside the reduced or the local field of view and to use the contributions within the reduced or local field of view for the reconstruction of the magnetic resonance image. The signal on the output of the reconstruction unit is applied to a monitor 26, so that the magnetic resonance image can be displayed on the monitor, for example, in the form of one or more two-dimensional density distributions, a three-dimensional density distribution or possibly also in the form of spectroscopic information. It is also possible to store the signal from the reconstruction unit in a buffer unit 27 while awaiting further processing.

FIG. 2 shows a diagram with examples of a field of view in which there are indicated examples of the reduced field of view and the local field of view, that is, relative to an object 31 to be examined. FIG. 2 shows the field of view in a plane in the k space which is defined by two phase encoding directions, for example, the z direction and the y direction. The direction of reading out, for example, the x direction, extends perpendicularly to the plane of drawing, that is, the (z, y) plane. The two phase encoding directions and one reading direction are used notably for reconstructing the magnetic resonance image as a three-dimensional data set of a spatial volume in the direction perpendicular to the plane of drawing. The full field of view (in the (z,y) plane) is denoted by the reference f-FOV. The somewhat smaller reduced field of view is referred to as r-FOV, and within the reduced field of view there is indicated the even smaller local field of view which is referred to as 1-FOV. Because the reduced field of view is smaller than the part of the object 31 which is to be examined, fold-over effects 41, 42 occur within the reduced field of view. The reduced field of view and the local field of view relate to sub-sampling of the magnetic resonance signals, for example, in the phase encoding direction. The magnetic resonance signals can be spatially encoded, in as far as the sub-sampling has induced ambiguity, on the basis of the spatial coil sensitivity profile. The folded-over pixel values within the reduced or local field of view can be decomposed, using the spatial coil sensitivity profiles, into pixel contributions originating from within or from outside the reduced or local field of view. Furthermore, during the reconstruction of the magnetic resonance image it is possible to take into account the fact that no signal contributions can occur from positions outside the object 30, for example, the point R. Within the reduced field of view there are the so-called folded-over pixel values, for example, at the positions $P_1$ and $P_2$, which are formed with contributions from within and outside the reduced field of view. At $P_1$, for example, there is a contribution to the pixel by $P_1$ itself and by $P_1'$ which is situated exactly one reduced field of view further. Similarly, in $P_2$ contributions occur from $P_2$ and $P_2'$. In accordance with the invention only the contribution from within the reduced field of view is used for the pixels within the reduced field of view so as to form the magnetic resonance image of the part within the reduced field of view. In this magnetic resonance image, for example, the detail 32 and also the details 33, 34 and 35 are faithfully reproduced, notably without fold-over artefacts. In accordance with the invention it is also possible, for example, to zoom in on the details 33, 34 and 35 by taking an even smaller local field of view (1-FOV) within the reduced field of view. For the sake of simplicity of the drawing of FIG. 2, only a small part of the fold-over phenomena is indicated in the local field of view (1-FOV). At the positions in the local field of view, such as $Q_1$, $Q_2$, $Q_3$ and $Q_4$, folded-over pixel values occur all the time. For example, in $Q_1$ there is a superposition of pixel values in $Q_1$ and $Q_1'$. A magnetic resonance image of the details 33, 34 and 35 is formed by utilizing exclusively the pixel contributions from within the local field of view.

FIG. 3 shows a diagram with further examples of the full field of view containing a reduced field of view and a local field of view, that is, relative to an object 31 to be examined. In FIG. 3 the plane of drawing is defined by a phase encoding direction (y) and the reading direction (x). The full field of view is referred to as f-FOV. The predetermined reduced field of view is referred to as rd-FOV and is determined in conformity with the degree of sub-sampling. The ratio of the size in the phase encoding direction (y) of the full field of view to that of the reduced field of view is referred to as the reduction factor or SENSE factor. The sub-sampled magnetic resonance signals have wave vectors within the reduced field of view. The pixel contributions within the reduced field of view can be calculated on the basis of the spatial sensitivity profiles so as to reconstruct the magnetic resonance image for the reduced field of view. It is also possible to select a predetermined, smaller field of view (rc-FOV) within the full field of view and to reject the pixel contributions from outside the smaller field of view on the basis of the coil sensitivity profile. The magnetic resonance image for the smaller field of view (rc-FOV) is reconstructed on the basis of the pixel contributions.

The invention claimed is:

1. A magnetic resonance imaging method of imaging an object in which
    sampled magnetic resonance signals are received by means of a receiving antenna having a spatial sensitivity profile,
        the sampling in the k space corresponding to a predetermined field of view in the geometrical space,
    folded-over pixel values of a folded-over image are reconstructed from the sampled magnetic resonance signals,
    pixel contributions at spatial positions within the predetermined field of view are calculated from the folded-over pixel values and the sensitivity profile of the receiving antenna, and
    the magnetic resonance image is formed from these pixel contributions at spatial positions within the predetermined field of view and in which the pixel contributions at spatial positions which lie within the object and outside the predetermined field of view are rejected.

2. A magnetic resonance imaging method as claimed in claim 1, in which
folded-over pixel values are decomposed into the pixel contributions at spatial positions within the predetermined field of view and at spatial positions outside the predetermined field of view.

3. A magnetic resonance imaging method as claimed in claim 1, in which
sub-sampled magnetic resonance signals are received by means of the receiving antenna having the spatial sensitivity profile, the sub-sampling in the k space corresponding to a reduced field of view in the geometrical space, and
the reduced field of view acts as the predetermined field of view.

4. A magnetic resonance imaging method as claimed in claim 1, in which
sub-sampled magnetic resonance signals are received by means of the receiving antenna having the spatial sensitivity profile, the sub-sampling in the k space corresponding to a reduced field of view in the geometrical space,
a full field of view is associated with the reduced field of view, the ratio of the size of the full field of view to the size of the reduced field of view being equal to the degree of sub-sampling of the sub-sampled magnetic resonance signals,
a smaller field of view is chosen within the full field of view, and
the smaller field of view acts as the predetermined field of view.

5. A magnetic resonance imaging method as claimed in claim 1, in which
successive local field of views are chosen within the predetermined field of view,
successive pixel contributions at spatial positions within the respective local fields of view are calculated from the folded-over pixel values and the sensitivity profile of the receiving antenna, and
successive magnetic resonance images are formed from these pixel contributions at spatial positions within the respective local fields of view.

6. A magnetic resonance imaging method as claimed in claim 5, in which the size of the successive local fields of view decreases or increases monotonously.

* * * * *